US008045372B2

(12) United States Patent
Lee

(10) Patent No.: US 8,045,372 B2
(45) Date of Patent: Oct. 25, 2011

(54) FLASH MEMORY DEVICE AND METHOD OF OPERATING THE SAME

(75) Inventor: Hee Youl Lee, Kyeongki-do (KR)

(73) Assignee: Hynix Semiconductor Inc., Icheon-si (KR)

(*) Notice: Subject to any disclaimer, the term of this patent is extended or adjusted under 35 U.S.C. 154(b) by 585 days.

(21) Appl. No.: 11/760,767

(22) Filed: Jun. 10, 2007

(65) Prior Publication Data

US 2008/0247234 A1 Oct. 9, 2008

(30) Foreign Application Priority Data

Apr. 6, 2007 (KR) .................. 10-2007-0034201

(51) Int. Cl.
*G11C 16/06* (2006.01)
*G11C 16/08* (2006.01)
*G11C 16/22* (2006.01)

(52) U.S. Cl. ......... 365/185.02; 365/185.13; 365/185.17; 365/185.18; 365/185.11; 365/185.23

(58) Field of Classification Search ............. 365/185.13, 365/185.17, 185.18, 185.11, 185.02, 185.23
See application file for complete search history.

(56) References Cited

U.S. PATENT DOCUMENTS

| 5,568,420 | A * | 10/1996 | Lim et al. .................. 365/185.17 |
| 6,262,926 | B1 * | 7/2001 | Nakai ........................... 365/200 |
| 2001/0005015 | A1 * | 6/2001 | Futatsuyama et al. ............ 257/1 |
| 2004/0113199 | A1 * | 6/2004 | Hazama et al. ................ 257/317 |
| 2005/0180213 | A1 * | 8/2005 | Abe et al. .................. 365/185.17 |
| 2006/0039230 | A1 * | 2/2006 | Kurata et al. .................. 365/232 |
| 2007/0253253 | A1 * | 11/2007 | Aritome ................... 365/185.17 |

FOREIGN PATENT DOCUMENTS

| KR | 1020000020030 A | 4/2000 |
| KR | 1020060031024 A | 4/2006 |
| KR | 1020060060528 A | 6/2006 |
| KR | 1020060074179 A | 7/2006 |
| KR | 1020060099142 A | 9/2006 |
| KR | 1020070018216 | 2/2007 |

* cited by examiner

*Primary Examiner* — J. H. Hur
(74) *Attorney, Agent, or Firm* — Kilpatrick Townsend & Stockton LLP

(57) ABSTRACT

A flash memory device includes a plurality of memory cell blocks, an operating voltage generator, a block switching unit and a voltage supply circuit. Each of the plurality of memory cell blocks includes select lines and word lines, and has pass word lines included between the select lines and the word lines. The operating voltage generator outputs operating voltages to global select lines, global word lines and global pass word lines. The block switching unit connects the global word lines to the word lines and the select lines in response to a block select signal. The voltage supply circuit is connected to the select line and the pass word line, and is configured to supply the select line and the pass word line with a ground voltage in response to a block select inverse signal.

10 Claims, 8 Drawing Sheets

FLASH MEMORY DEVICE AND METHOD OF OPERATING THE SAME

CROSS-REFERENCES TO RELATED APPLICATIONS

The present application claims priority to Korean patent application number 10-2007-34201, filed on Apr. 6, 2007, which is incorporated by reference in its entirety.

BACKGROUND OF THE INVENTION

The present invention relates to flash memory devices and, more particularly, to a flash memory device in which a pass word line is included between a select line and a word line, and a method of operating the same.

A flash memory device has a characteristic in which data is retained even after the supply of power is cut off. The flash memory device is largely classified into NAND flash memory and NOR flash memory. Of them, the NAND flash memory is described below.

FIG. 1 is a view illustrating a program operation in a memory block of a NAND flash memory device.

Referring to FIG. 1, the NAND flash memory device includes a memory cell array. The memory cell array includes a plurality of memory cell blocks. Each of the memory cell blocks includes a plurality of strings. It is to be noted that only two strings ST1 and ST2 are illustrated in the drawings for convenience. Each cell string includes a drain select transistor DST, a plurality of memory cells C0 to Cn and a source select transistor SST, all of which are connected in series. The drain select transistors DST included in the cell string ST1 and ST2 are connected to bit lines BL1 and BL2, respectively. The source select transistors SST are connected in parallel to a common source line CSL. Meanwhile, the gates of the drain select transistors DST included in the respective cell strings ST1 and ST2 are connected to become a drain select line DSL, and the gates of the source select transistors SST are connected to become a source select line SSL. Furthermore, the gates of the memory cells C0 to Cn are connected to become word lines WL0 to WLn, and word lines become a page unit. In this case, 2, 4, 8, 16 or 32 pages form one page group.

When a program operation is performed in the memory cell array constructed above, a program voltage Vpgm is applied to a word line (for example, WLi) of a selected memory cell (a memory cell to be programmed), and a pass voltage Vpass is applied to the remaining word lines. Further, a ground voltage (for example, 0V) is applied to the bit line BL2 connected to a string (for example, ST2) in which the selected memory cell is included, and a program-prohibit voltage (for example, Vcc) is applied to the bit line connected to the remaining strings. If the program operation is performed under these voltage conditions, the program operation is carried out in the selected memory cell Ci due to a voltage difference between the word line and the channel region.

Meanwhile, the program voltage Vpgm is also applied to the memory cell Bi included in the string ST1, to which the program-prohibit voltage is applied. Channel boosting is generated due to capacitor coupling. Thus, as the voltage of the channel region rises, the voltage difference between the gate and the channel region decreases, and the program operation is not carried out. This is called a program disturb. At this time, if the channel boosting level increases, a margin with respect to program disturb is increased. However, if the channel boosting level increases, the following problems may happen.

FIG. 2 is a cross-sectional view illustrating a program disturbance mechanism of a memory cell adjacent to a select transistor when programming a conventional NAND flash memory device.

At the time of the program operation of the flash memory device, a program voltage (for example, 18V) is applied to a selected word line (for example, the word line WL0 adjacent to the source select transistor), and a pass voltage (for example, 10V) lower than the program voltage is applied to unselected word lines WL1 to WL31. The program voltage may employ a voltage of 16V to 19V and the pass voltage may employ a voltage of 9V to 11V. Furthermore, a power supply voltage Vcc is applied to the source 215 connected to the common source line CSL, the ground voltage is applied to the source select line SSL of the source select transistor SST, and the power supply voltage Vcc is applied to the drain select line DSL of the drain select transistor DST.

Meanwhile, if a memory cell M0 to which the program voltage is applied is not a target program cell (that is, in the case of a string on which the program operation is not being performed), the power supply voltage Vcc is applied to a drain 210 connected to the bit line BL0 in order to prevent the memory cell M0 from being programmed.

It becomes difficult to sufficiently secure a distance between neighboring cells due to the high integration degree of a flash memory device. Thus, at the time of a self-channel boosting operation for preventing a memory cell from being programmed, a shift in the threshold voltage Vth of the memory cell M0 having the word line WL0 adjacent to the source select transistor SST becomes profound. This is caused by a program disturbance in which unselected cells are programmed as electrons are injected from the source select transistor SST to the word line WL0 because Gate Induced Drain Leakage (GIDL) is generated at the junction that is shared by the word line WL0 to which the program voltage is applied and the source select transistor SST in a string on which a program opertation is not being performed. This is based on the following mechanism.

First, upon "1" program, local high channel boosting (①) is formed by means of a high bias. GIDL current (②) is generated by means of a high junction potential at an edge portion A where the junction of the selected word line WL0 and an adjacent source select transistor SST is shared. Hot carriers of electron-hole pairs (③) are generated by means of a strong corner field caused by the channel boosting potential. The hot electrons of the hot carriers are moved into the cell string due to a lateral electric field caused by the channel boosting potential. Hot carriers (④) are generated in the channel region 205 below the selected word line WL0 due to the high electric field. The hot electrons of hot carriers (⑤), which are generated by the channel region 205 below the selected word line WL0, are injected into the floating gate 130 by means of the occurrence of a high vertical electric field caused by the program voltage Vpgm/the pass voltage Vpass.

In this mechanism, the electrons formed at the edge portion A where the junction of the memory cell M0 connected to the word line WL0 adjacent to the source select transistor SST and the source select transistor SST is shared are moved from the source select transistor SST to the neighboring word line WL0 by means of the channel boosting potential and then accelerated. Thus, the electrons have a hot electron characteristic to the extent that the word line WL0 can be programmed. Due to this, at the time of the program operation, the threshold voltage Vth of the flash memory cell M0 connected to the word line WL0 adjacent to the source select transistor SST is changed. Furthermore, a similar phenomenon is generated in the memory cell M31 connected to the word line WL31 adjacent to the drain select transistor DST, so that the threshold voltage Vth may be changed.

Meanwhile, though not illustrated in FIG. 2, problems that may occur within a string including a memory cell to be programmed at the time of the program operation are described below.

At the time of a program operation, a large number of memory cells within one page are programmed. It is thus preferred that the program operation be carried out so that program threshold voltage distributions become narrow. The fact that program threshold voltage distributions are wide means that the difference in the program threshold voltage of a cell having a fast program speed and a cell having a slow program speed is great. It has a bad influence on the operating characteristics of the memory cell. In this case, the interference phenomenon causes the program speed of the memory cell to become slow.

The program operation is an operation for injecting electrons from the channel region to the floating gate by raising the potential of the floating gate higher than that of the channel region. At this time, the potential of the floating gate is decided by the word line bias and the capacitive coupling ratio of the potential of the channel region.

FIG. 3 is a cross-sectional view illustrating an interference phenomenon occurring between a selected cell and peripheral cells.

Referring to FIG. 3, at the time of the program operation, the program voltage Vpgm is applied to the word line WLi of a selected cell, and the pass voltage Vpass is applied to the word lines WLi−1 and WLi+1 of a cell formed near the selected cell. Reference numeral 300 refers to a semiconductor substrate, 302 refers to a tunneling insulating layer, 304 refers to a floating gate, 306 refers to a dielectric layer, 308 refers to a control gate, and 310 refers to a junction region.

In the above, as the cell gap decreases, the interference capacitive coupling ratio A of about 0.15 is obtained between the floating gate of the selected cell and the control gate of the peripheral cell. Accordingly, the pass voltage applied to the peripheral cell influences the program speed of the selected cell.

FIG. 4 is a characteristic graph illustrating the difference in the program speed depending on the level of the pass voltage.

From FIG. 4, it can be seen that as the level of the pass voltage rises, variation in the threshold voltage due to the program operation becomes great. In other words, as the pass voltage rises, the level of the program threshold voltage rises, which results in a fast program speed.

In particular, the threshold voltage (②) of a memory cell connected to the outermost word lines WL0 and WLn of the word lines is lower than the threshold voltage (①) of a memory cell connected to the word lines WL1 to WLn−1 located between the word lines WL0 and WLn. This means that the program speed is slow. This is because though in the outermost word lines WL0 and WLn, neighboring word lines exist only on one side, whereas in the word lines WL1 to WLn−1 located between them, neighboring word lines exist on both sides.

To overcome the problem, a method of increasing the width of the outermost word line or increasing the space between the word lines was proposed. However, not only the degree of integration is decreased, but also channel resistance is increased and the cell current is decreased. Accordingly, other fundamental methods are required.

As described above, the program speed and the erase speed of a memory cell located at the outermost place are slow. Therefore, in order to improve an erase operating characteristic, a high erase voltage is used. In this case, if the erase operation and the program operation are repeatedly performed several hundreds of thousand times, the operating characteristic of the memory cell (in particular, the erase/program cycling characteristics) is significantly degraded.

SUMMARY OF THE INVENTION

Accordingly, the present invention relates to a flash memory device and a method of operating the same, in which a pass word line is formed between a select line and a neighboring word line, and at the time of a program/erase operation, bias applied to the pass word lines applied to a selected block and an unselected block are controlled, so that a difference between the program/erase speed of a memory cell connected to the outermost word line and the program/erase speed of the remaining memory cells can be minimized, and operating characteristics, such as erase/program cycling characteristics, and reliability can be improved.

In an aspect, the present invention provides a flash memory device including a plurality of memory cell blocks, an operating voltage generator, a block switching unit and a voltage supply circuit. Each of the plurality of memory cell blocks includes select lines and word lines, and has pass word lines included between the select lines and the word lines. The operating voltage generator outputs operating voltages to global select lines, global word lines and global pass word lines. The block switching unit connects the global word lines to the word lines and the select lines in response to a block select signal. The voltage supply circuit is connected to the select line and the pass word line, and is configured to supply the select line and the pass word line with a ground voltage in response to a block select inverse signal.

In another aspect, the present invention provides a method of operating a flash memory device, including the steps of providing a plurality of memory cell blocks respectively comprising a drain select line, a source select line and word lines and having a drain pass word line and a source pass word line provided between the drain select line and the word line and between the source select line and the word line, respectively; and performing a program operation in a state where a drain pass word line and a source pass word line of a selected memory cell block are applied with a pass voltage and drain pass word lines and source pass word lines of unselected memory cell blocks are applied with a ground voltage.

In further another aspect, the present invention provides a method of operating a flash memory device, including the steps of providing a plurality of memory cell blocks respectively comprising a drain select line, a source select line and word lines, and having a drain pass word line and a source pass word line provided between the drain select line and the word line and between the source select line and the word line, respectively; and performing a read operation in a state where a drain pass word line and a source pass word line of a selected memory cell block are applied with a read pass voltage, and drain pass word lines and source pass word lines of unselected memory cell blocks are applied with the read pass voltage or a ground voltage.

In further another aspect, the present invention provides a method of operating a flash memory device, including the steps of providing a plurality of memory cell blocks respectively comprising a drain select line, a source select line and word lines, and having a drain pass word line and a source pass word line provided between the drain select line and the word line and between the source select line and the word line, respectively; and performing an erase operation in a state where a drain pass word line and a source pass word line of a selected memory cell block are applied with a ground voltage and drain pass word lines and source pass word lines of unselected memory cell blocks are set to a floating state.

DETAILED DESCRIPTION OF EMBODIMENTS

Specific embodiments according to the present patent will be described with reference to the accompanying drawings.

Figure 5:
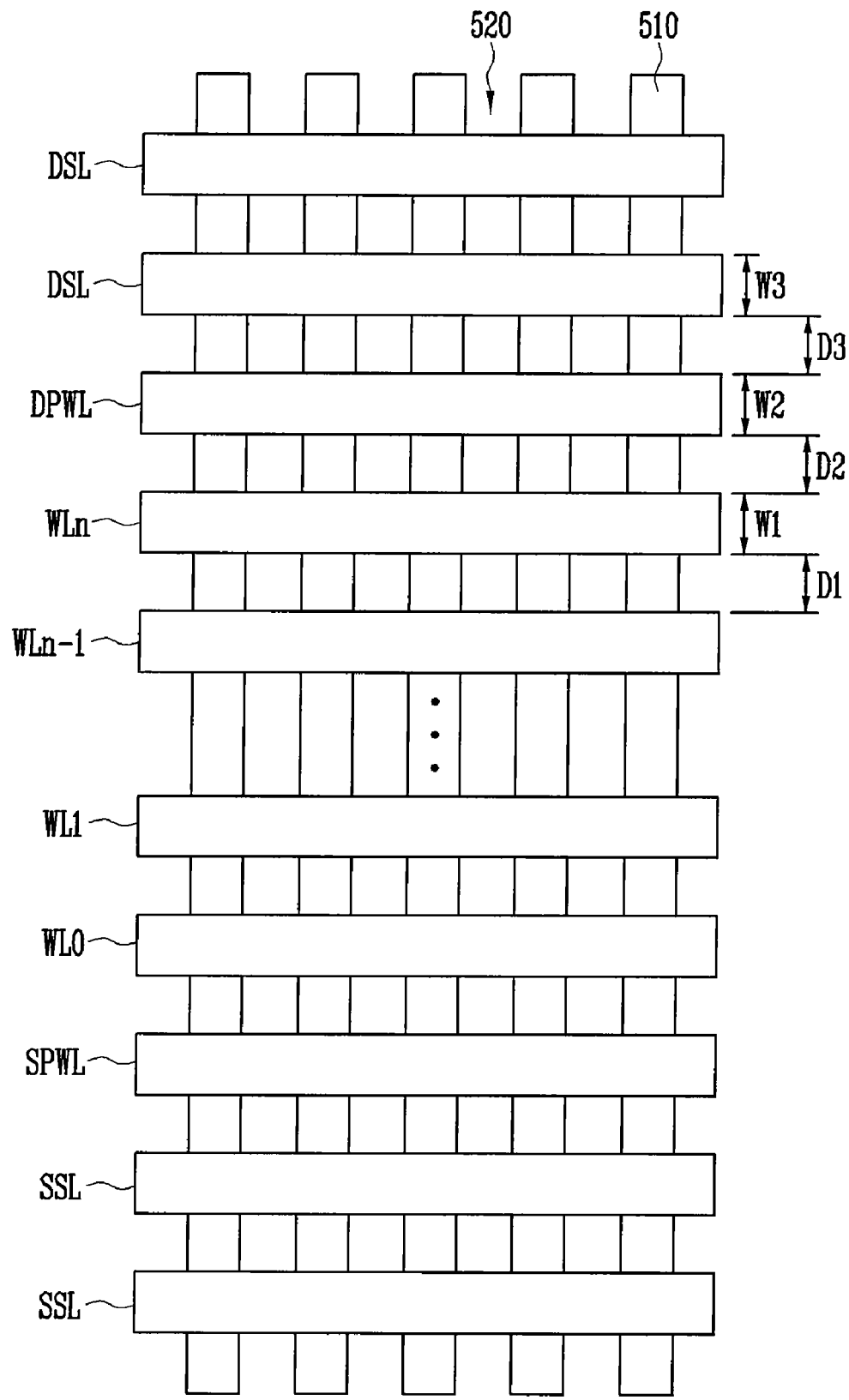
FIG. 5 is a layout diagram illustrating the cell array of a flash memory device according to an embodiment of the present invention.

FIG. 5 is a layout diagram illustrating the cell array of a flash memory device according to an embodiment of the present invention.

Referring to FIG. 5, a semiconductor substrate includes an active region 510 and an isolation region 520. The active region 510 and the isolation region 520 are alternately defined in a memory cell array region in parallel. An isolation layer is formed in the isolation region 520. A plurality of drain select lines DSL, a plurality of word lines WL0 to WLn and a source select line SSL, which cross the active region 510 and the isolation region 520, are formed over the semiconductor substrate. The plurality of word lines WL0 to WLn are formed between the drain select line DSL and the source select line SSL. The term "select line" is used to refer to the drain select line DSL or the source select line SSL.

In particular, in the present invention, pass word lines SPWL and DPWL are formed between a word line (for example, WL0 or WLn) of the word lines, which is located at the outermost place, and a select line. More specifically, the source pass word line SPWL is formed between the first word line WL0 and the source select line SSL, and the drain pass word line DPWL is formed between an $n^{th}$ word line WLn and the drain select line DSL. The source and drain pass word lines SPWL and DPWL have a structure including a tunneling insulating layer, a floating gate, a dielectric layer and a control gate in the same manner as a general word line. Further, at the time of the program/erase/read operations, the pass word lines SPWL and DPWL are applied with operating voltages of different levels, respectively. Detailed operating voltages are described later on.

On the other hand, the pass word lines SPWL and DPWL can be formed to have the same width W1 as that of word lines formed therebetween. Each of the select lines DSL and SSL can also be formed to have a width W3, which is the same as the width W1 of the word lines. Consequently, the pass word lines SPWL and DPWL, the select lines DSL and SSL and the word lines WL0 to WLn can be all formed to have the same widths W1, W2 and W3.

Furthermore, a distance D2 between the pass word lines SPWL and DPWL and the word lines can be set to be the same as a distance D1 between the word lines WL0 to WLn. A distance D3 between the pass word lines SPWL and DPWL and the select lines can also be set to be the same as the distance D1 between the word lines WL0 to WLn. In this case, the distances D1 to D3 of the select lines DSL and SSL, the pass word lines SPWL and DPWL and the word lines WL0 to WLn become identical.

In the conventional method, the select lines DSL and SSL had a width wider than that of the word lines WL0 to WLn, and the distance between the select lines DSL and SSL and the word lines was wider than that between the word lines WL0 to WLn. However, in the present invention, the width of the select lines DSL and SSL are set to be the same as that of the word lines WL0 to WLn, and the distance between the select lines DSL and SSL and the word lines is also set to be the same as that between the word lines WL0 to WLn. Therefore, although the pass word lines SPWL and DPWL are formed additionally, a reduction in the degree of integration can be prevented or minimized.

Figure 1:
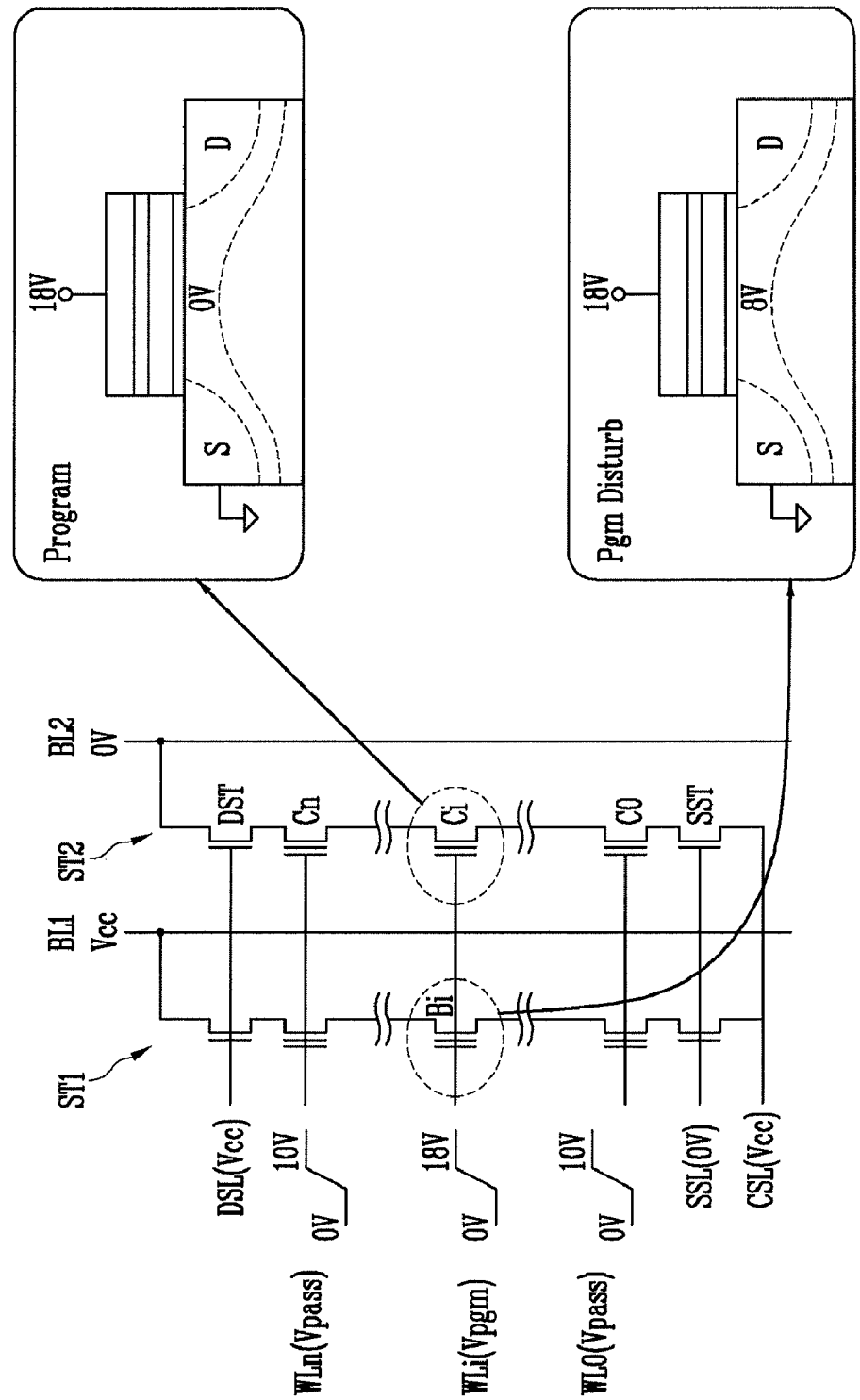
FIG. 1 is a view illustrating a memory block and a program operation of a NAND flash memory device.
Figure 2:
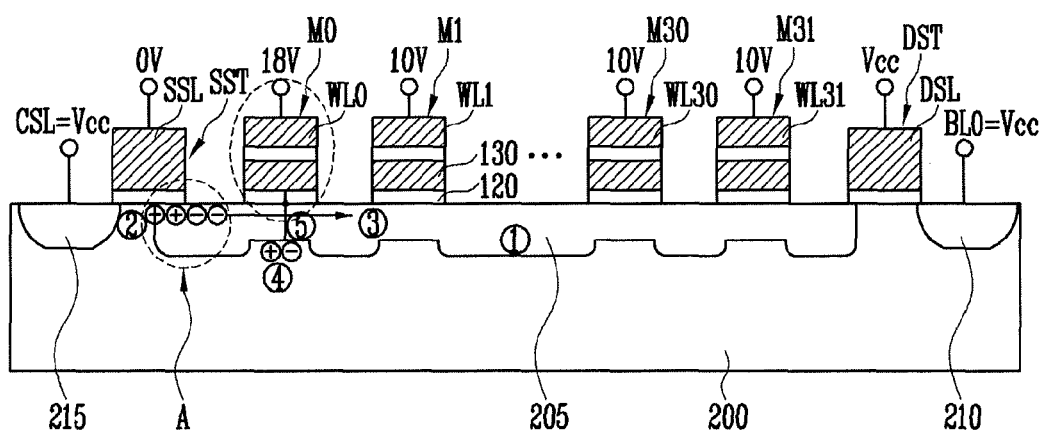
FIG. 2 is a cross-sectional view illustrating a program disturbance mechanism of a memory cell adjacent to a select transistor when programming a conventional NAND flash memory device.

As the added pass word lines SPWL and DPWL are formed as described above, the word lines WL0 and WLn to which a memory cell for storing data actually is connected are formed far from the hot carrier formation region illustrated in FIG. 2 as much as that the pass word lines SPWL and DPWL are formed. It is therefore possible to prevent an unwanted dramatic pgm disturb phenomenon from occurring in the first word line WL0 and the last word line and WLn. Furthermore, the program phenomenon can be prevented from occurring in unselected word lines because a high channel boosting level can be maintained in the whole channel region within the string. In particular, since it is not necessary to apply the program voltage to the pass word lines SPWL and DPWL, the dramatic program phenomenon is not generated and the threshold voltage can be kept constant. Accordingly, no problems occur in the program operation or the read operation. The following advantages can also be obtained.

Figure 3:
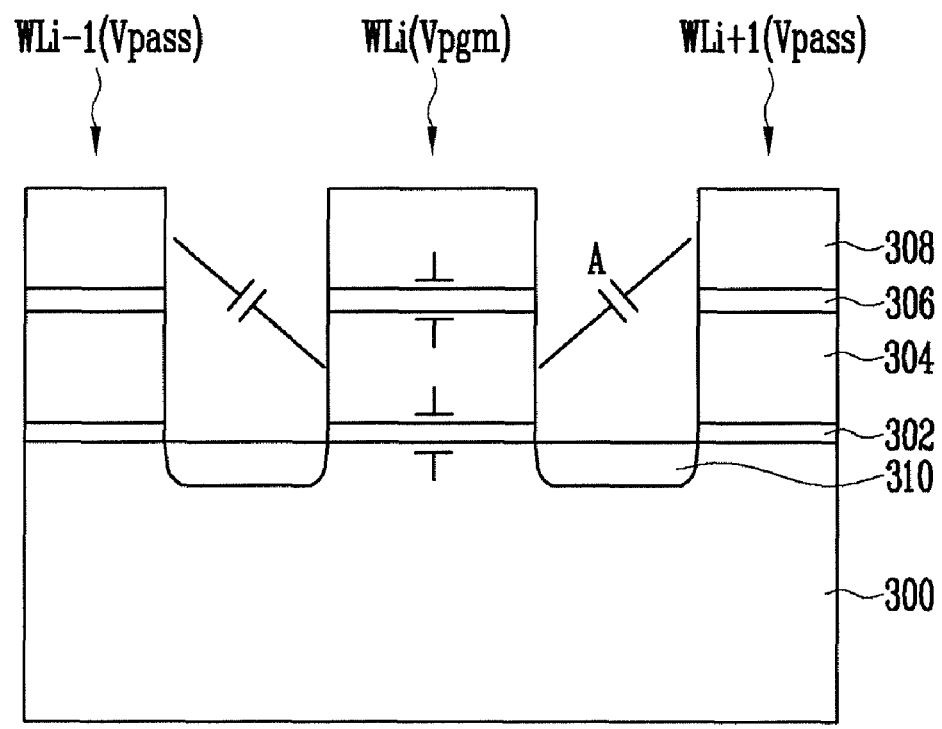
FIG. 3 is a cross-sectional view illustrating an interference phenomenon occurring between a selected cell and peripheral cells.
Figure 4:
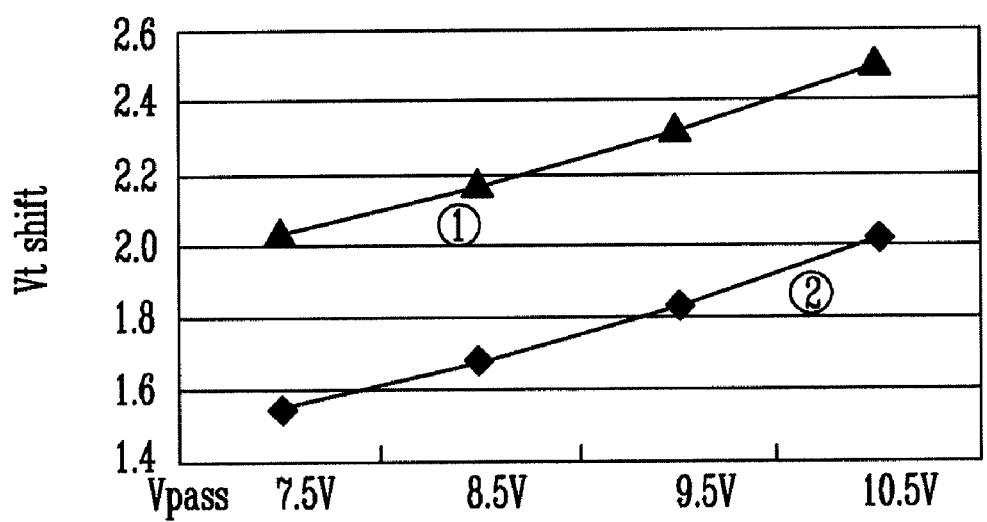
FIG. 4 is a characteristic graph illustrating the difference in the program speed depending on the level of pass voltage.

First, since the width and distance of all the word lines are the same, the interference coupling ratio between the word lines become identical in the entire memory cells. Second, the coupling ratio between neighboring floating gates also becomes identical. Third, the pass voltage is applied to the select lines DSL and SSL and neighboring pass word lines SPWL and DPWL at the time of the program operation. Thus, the distributions of the program threshold voltage can be narrowed since the coupling phenomenon generated at both sides of the first or last word line WL0 or WLn (refer to the description made with reference to FIG. 3) becomes identical. Fourth, the width (the gate length) of the select lines DSL and SSL is decreased and the width and distance of the entire lines are the same. Accordingly, not only a patterning characteristic and uniformity in the manufacturing process, but also channel resistance can be decreased, and cell current can be increased accordingly.

The operating voltage applied to the pass word lines SPWL and DPWL at the time of program/erase/read operations will be hereinafter described in detail.

At a time of the program operation, voltages necessary for the program operation are applied under the condition of the following Table 1.

TABLE 1

|  | SSL SSL | SPWL SPWL | Selected WL | Unselected WL | DPWL DPWL | DSL DSL |
|---|---|---|---|---|---|---|
| Selected block | 0 V | Vpass | Vpgm | Vpass | Vpass | Vcc |
| Unselected block | 0 V | 0 V |  | Floating | 0 V | 0 V |

Referring to Table 1, at the time of the program operation, in the selected block, the drain select line DSL is applied with the power supply voltage Vcc and the source select line SSL is applied with the ground voltage 0V. Further, the word line connected to the memory cell to-be-programmed is applied with the program voltage Vpgm and the remaining word lines are applied with the pass voltage Vpass. The pass word lines SPWL and DPWL are applied with the pass voltage Vpass.

Meanwhile, in the unselected block, all the word lines are in a floating state, and the select lines DSL and SSL and the pass word lines SPWL and DPWL are applied with the ground voltage 0V.

At a time of the read operation, voltages necessary for the read operation are applied under the condition of the following Table 2.

TABLE 2

|  | SSL SSL | SPWL SPWL | Selected WL | Unselected WL | DPWL DPWL | DSL DSL |
|---|---|---|---|---|---|---|
| Selected block | Vcc | Vreadpass | Vread | Vreadpass | Vreadpass | Vcc |
| Unselected block | 0 V | Vreadpass |  | Floating | Vreadpass | 0 V |

Referring to Table 2, at the time of the read operation, in the selected block, the select lines DSL and SSL are applied with the power supply voltage Vcc, the word line to which the memory cell to-be-programmed is connected is applied with the read voltage Vread, and the remaining word lines are applied with the read pass voltage Vreadpass. The pass word lines SPWL and DPWL are applied with the read pass voltage Vreadpass.

Meanwhile, in the unselected block, all the word lines become floated, the select lines DSL and SSL are applied with the ground voltage 0V, and the pass word lines SPWL and DPWL are applied with the read pass voltage Vreadpass.

In this case, the read pass voltage Vreadpass is a voltage for turning on memory cells connected to the unselected word lines during the read operation, and is higher at least 0.5V than the threshold voltage of the program state. In the case of the pass word lines SPWL and DPWL, variation in the threshold voltage with respect to stress of the read operation is very small. Thus, it does not have an effect on the operation although read pass voltage Vreadpass is applied to the pass word lines SPWL and DPWL.

Unlike the above, at the time of the read operation, in the unselected block, the pass word lines SPWL and DPWL can be applied with 0V in order to further minimize the leakage current between the bit line and the common source line, as in Table 3. In other words, all the word lines WL0 to WLn of the unselected block become floating, and the select lines DSL and SSL and the pass word lines SPWL and DPWL are all applied with the ground voltage 0V.

TABLE 3

|  | SSL SSL | SPWL SPWL | Selected WL | Unselected WL | DPWL DPWL | DSL DSL |
|---|---|---|---|---|---|---|
| Selected block | Vcc | Vreadpass | Vread | Vreadpass | Vreadpass | Vcc |
| Unselected block | 0 V | 0 V |  | Floating | 0 V | 0 V |

In this case, since the memory cells connected to the drain pass word line DPWL and the source pass word line SPWL are all turned off, the occurrence of the leakage current between the bit line and the common source line can be further prevented.

In the erase process of the memory cell, voltages necessary for the program operation can be applied under the condition of the following Table 4. The erase process includes an erase operation for lowering the threshold voltage of an actual memory cell, a post program operation for narrowing threshold voltage distributions of erased memory cells, and a verify operation for detecting the threshold voltage of erased memory cells. A bias condition for each of the operations can be set as in Table 4.

TABLE 4

|  |  | SSL | SPWL | WL0 to WLn | DPWL | DSL |
|---|---|---|---|---|---|---|
| Erase operation | Selected block | Floating |  | 0 V |  | Floating |
| Erase operation | Unselected block |  |  | Floating |  |  |
| Post program | Selected block |  | 0 V |  | Vpostpgm | Vcc |
| Post program | Unselected block | 0 V | 0 V |  | Floating 0 V | Vcc |
| Verify operation | Selected block | Vcc | Vreadpass | 0 V | Vreadpass | Vcc |

Referring to Table 4, the erase operation is performed on condition that the select lines DSL and SSL of the selected block is set to the floating state and the word lines WL0 to WLn are applied with the ground voltage 0V. In this case, the pass word lines SPWL and DPWL are also applied with the ground voltage 0V. Further, the select lines DSL and SSL, the pass word lines SPWL and DPWL and the word lines WL0 to WLn of the unselected block are all set to a floating state.

In the above, as the erase operation is repeated, the threshold voltage of the memory cell connected to the pass word lines SPWL and DPWL can continue to lower. Thus, the pass word lines SPWL and DPWL can be set to the floating state so that the erase operation is not performed due to the increased voltage of the pass word lines SPWL and DPWL, which is caused by capacitor coupling due to the erase voltage applied to the well region at the time of the erase operation.

In the post program operation, in the selected block, the source select line SSL is applied with the ground voltage 0V, and the drain select line DSL is applied with the power supply voltage Vcc. In addition, the word lines WL0 to WLn and the pass word lines SPWL and DPWL are applied with the post program voltage Vpostpgm. The post program voltage Vpostpgm is applied with a level lower than that of the program voltage Vpgm applied in a general program operation.

In the above, as the post program operation is repeated, the threshold voltage of the memory cell connected to the pass word lines SPWL and DPWL can continue to lower. Accordingly, the pass voltage Vpass, which had been applied to the unselected word line in the general program operation, can be applied to the pass word lines SPWL and DPWL at the time of the post program operation.

Meanwhile, in the unselected block, the source select line SSL is applied with the ground voltage 0V, the drain select line DSL is applied with the power supply voltage Vcc, and the word lines WL0 to WLn are set to the floating state. The pass word lines SPWL and DPWL are also applied with the ground voltage 0V.

Thereafter, in the erase verify operation, the select lines DSL and SSL are applied with the power supply voltage Vcc, and the pass word lines SPWL and DPWL are applied with the read pass voltage Vreadpass and the word lines WL0 to WLn are applied with the ground voltage 0V such that the memory cells connected to the pass word lines SPWL and DPWL are turned on.

In general, not only the select lines DSL and SSL, but also the pass word lines SPWL and DPWL are applied with voltages necessary for the operation through the global select line and the global pass word line. However, when considering the bias application conditions of the above-described program/read/erase operations, the select lines DSL and SSL and the pass word lines SPWL and DPWL of the selected block and the unselected block must be applied with voltages of different levels. Therefore, in order to apply voltages of different levels, some of the circuit must be modified. This can be described below in detail.

Figure 6:
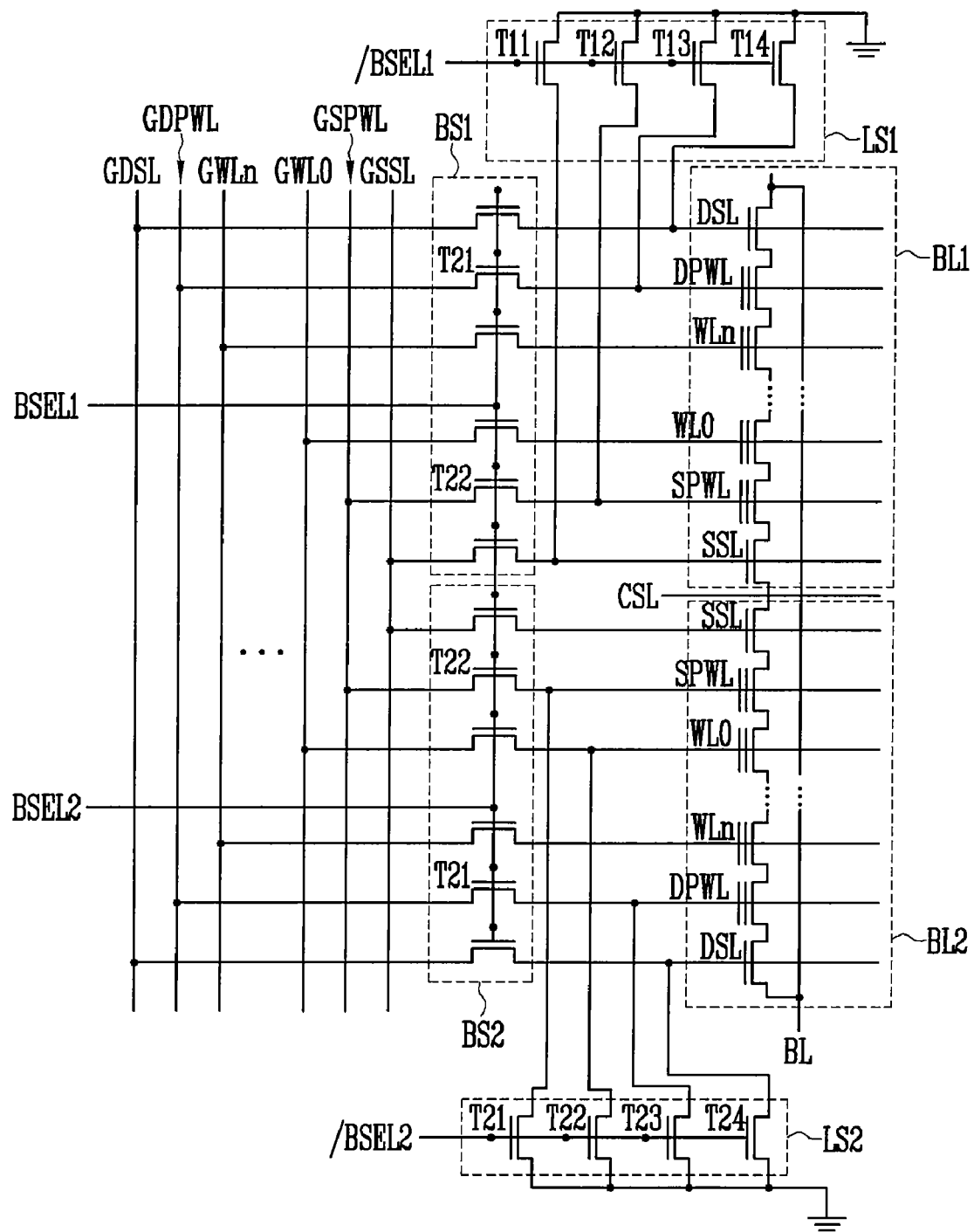
FIG. 6 is a circuit diagram of a memory device according to an embodiment of the present invention.
Figure 7:
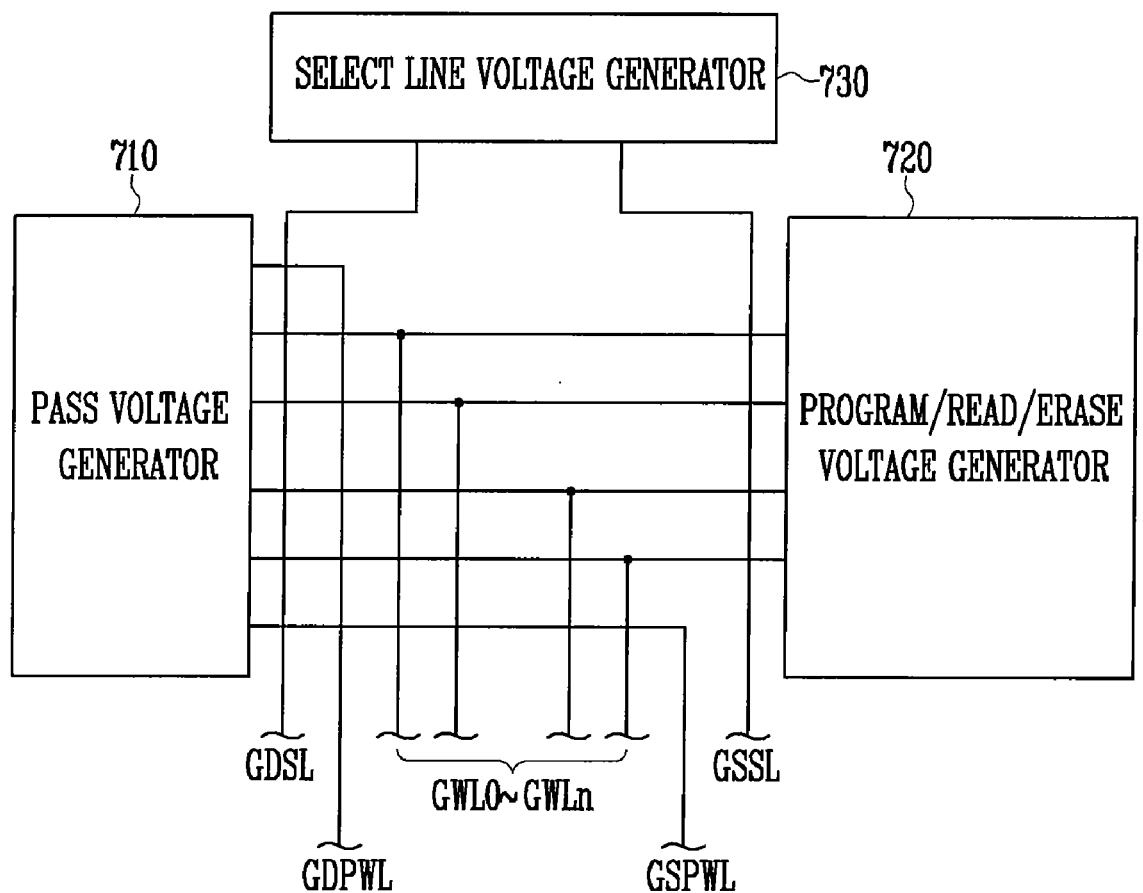
FIG. 7 is a block diagram of a circuit for outputting voltages necessary for the program/read/erase operations to word lines and a pass word line.

FIG. 6 is a circuit diagram of a memory device according to an embodiment of the present invention. FIG. 7 is a block diagram of a circuit for outputting voltages necessary for the program/read/erase operations to word lines and a pass word line.

Referring to FIGS. 6 and 7, a memory cell array includes a plurality of memory cell blocks (only two memory cell blocks BL1 and BL2 are illustrated for convenience). Each block includes a plurality of strings. Each string includes a drain select transistor connected to a drain select line DSL and a source select transistor connected to a source select line SSL. Memory cells connected to word lines WL0 to WLn are connected between the drain select transistor and the source select transistor. Furthermore, in the present invention, a pass memory cell connected to a source pass word line SPWL is connected between a first memory cell and a drain select transistor within the string, and a pass memory cell connected to the drain pass word line DPWL is connected between the last memory cell and the drain select transistor within the string. The drain of the drain select transistor is connected to a bit line BL, and the source of the source select transistor is connected to a common source line CSL.

The lines SSL, SPWL, WL0 to WLn, DPWL and DSL are connected to global lines GSSL, GSPWL, GWL0 to GWLn, GDPWL and GDSL through a block switching unit (for example, BS1). The block switching unit BS1 connects the lines to the global lines according to a block select signal (for example, BSEL1). The block switching unit BS1 includes switching elements, which are respectively connected between the lines SSL, SPWL, WL0 to WLn, DPWL and DSL, and the global lines GSSL, GSPWL, GWL0 to GWLn, GDPWL and GDSL, and operate according to the block select signal BSEL1. In this case, the switching element may include a NMOS transistor.

The pass voltage or the operating voltages generated in the pass voltage generator 710, the program/read/erase voltage generator 720 and the select line voltage generator 730 are output to the global lines GSSL, GSPWL, GWL0 to GWLn, GDPWL and GDSL. Further, as the lines SSL, SPWL, WL0 to WLn, DPWL and DSL of the selected block are connected to the global lines GSSL, GSPWL, GWL0 to GWLn, GDPWL and GDSL, respectively, by means of the block switching unit BS1, the pass voltage or the operating voltages are respectively applied to the lines SSL, SPWL, WL0 to WLn, DPWL and DSL. Consequently, the pass voltage generator 710, the program/read/erase voltage generator 720 and the select line voltage generator 730 become operating voltage generators for outputting voltages necessary to operate a flash memory device.

Meanwhile, the memory device of the present invention additionally includes voltage supply circuits LS1 and LS2 for applying voltages of different levels to the select lines DSL and SSL and the pass word lines SPWL and DPWL of a selected block (for example, BL1) and an unselected block (for example, BL2) at the time of the program/read/erase operations. In detail, the voltage supply circuit is equipped in every block, and a voltage supply circuit (for example, LS2) included in an unselected block connects the select lines DSL and SSL and the pass word lines SPWL and DPWL, which are included in the memory cell block, to a ground terminal in response to the block select inverse signal /BSEL2.

Meanwhile, the voltage supply circuit (for example, LS1) included in a selected memory cell block does not operate in response to the block select inverse signal /BSEL1. Due to this, the select lines DSL and SSL and the pass word lines SPWL and DPWL are applied with voltages necessary for the program, erase or read operation through the global select lines GDSL and GSSL and the global pass word lines GSPWL and GDPWL. Therefore, through the global select lines GDSL and GSSL and the global pass word lines GSPWL and GDPWL are shared, the select lines DSL and SSL and the pass word lines SPWL and DPWL of the selected block and the unselected block can be applied with voltages of different levels. Examples in which the select lines DSL and SSL and the pass word lines SPWL and DPWL of the selected block and the unselected block are applied with voltages of different levels as described above have been described with reference to Tables 1 to 3.

Referring back to the block switching unit BS1 of FIG. 6, the pass word lines SPWL and DPWL are additionally included in the present invention. Thus, switching elements T21 and T22 for connecting the pass word lines SPWL and DPWL and the global pass word lines GSPWL and GDPWL are also additionally included in the block switching unit BS1. As the switching elements T21 and T22 are additionally installed, an area occupied by the elements is increased. In this case, the area occupied by the elements can be reduced by removing the switching elements and directly connecting the pass word lines SPWL and DPWL and the global pass word lines GSPWL and GDPWL.

However, if the pass word lines SPWL and DPWL and the global pass word lines GSPWL and GDPWL are connected directly, the pass word lines SPWL and DPWL of the unselected block are continuously applied with the pass voltage. Accordingly, stress may be applied, or the threshold voltage of the memory cell connected to the pass word lines SPWL and DPWL may be changed. Therefore, the whole blocks are divided into several groups, and the switching elements are formed on a group basis in order to connect the pass word lines SPWL and DPWL to the global pass word lines GSPWL and GDPWL. Thus, stress or variation in the threshold voltage can be reduced while minimizing an increase of an area occupied by elements. This is described below in detail.

Figure 8:
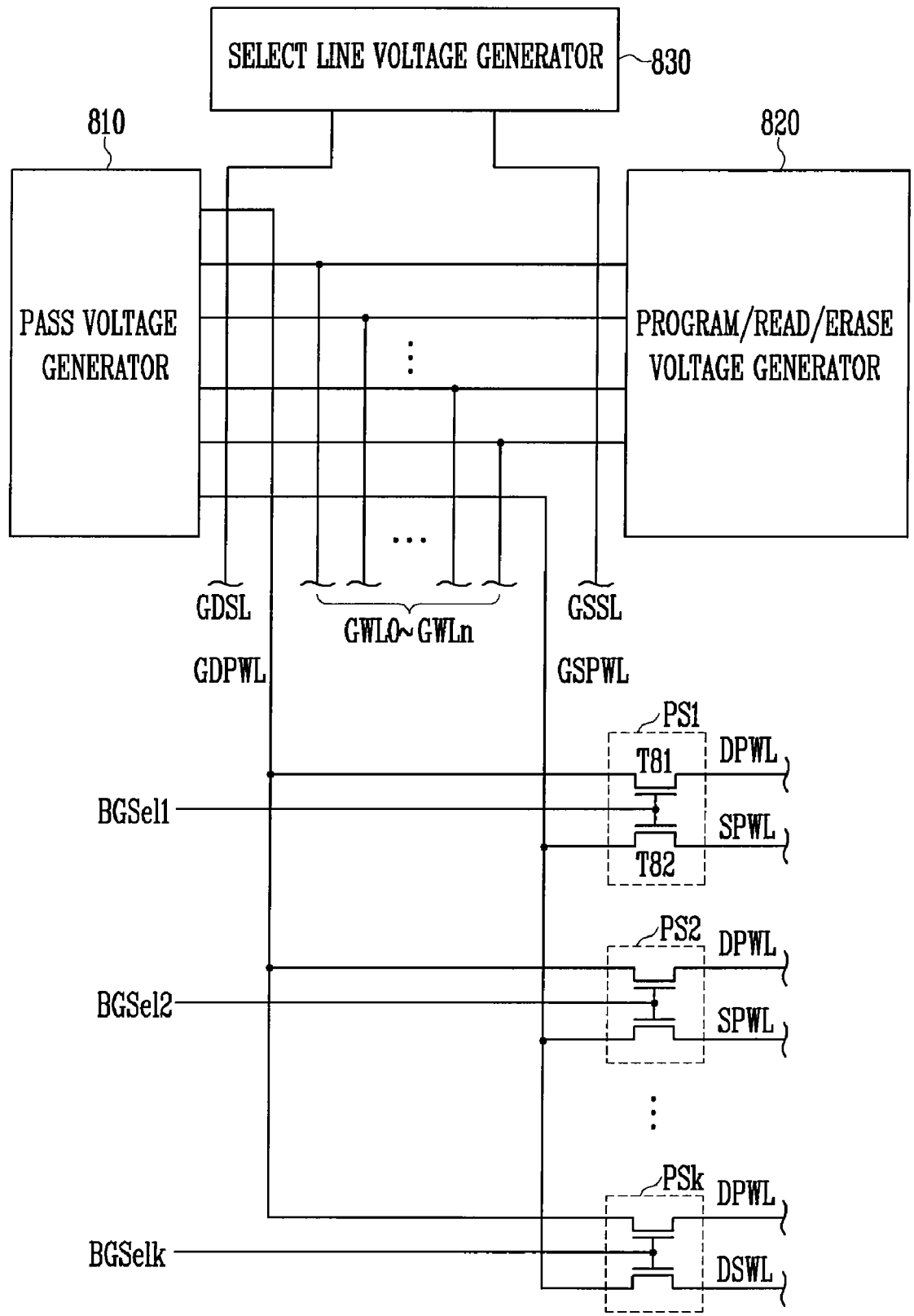
FIG. 8 is a circuit diagram illustrating a flash memory device and a method of operating the same according to another embodiment of the present invention.

FIG. 8 is a circuit diagram illustrating a flash memory device and a method of operating the same according to another embodiment of the present invention.

Referring to FIG. 8, global word lines GWL0 to GWLn are selectively connected to word lines WL0 to WLn included in blocks through the block switching units BS1 and BS2 shown in FIG. 6 as in the prior art. However, global pass word lines GSPWL and GDPWL are connected to pass word lines SPWL and DPWL included in a block in a different way.

To this end, the memory cell blocks are divided into several groups (for example, k groups). The number of blocks included in one block group is a value in which the number of the whole blocks is divided by a block group number k. Though not illustrated in the drawing, in the case where 2048 memory cell blocks are divided into 64 groups, the number of memory cell blocks included in one block group becomes 32. In this case, unlike the block switching units BS1 and BS2 shown in FIG. 6, the number of switching units PS1 to PSk for connecting the global pass word lines GSPWL and GDPWL and the pass word lines SPWL and DPWL is disposed as many as the number of block groups. Each of the switching units PS1 to PSk includes a first switching element T81 to which the global drain pass word line GDPWL and the drain or the source are connected, and a second switching element T82 to which a global source pass word line GSPWL and the drain or the source are connected.

The source or the drain of the first switching element T81 is commonly connected to the drain pass word lines DPWL included in every memory cell block of a corresponding block group. Further, the source or the drain of the second switching element T82 is commonly connected to the source pass word lines SPWL included in every memory cell block of a corresponding block group. The first and second switching elements T81 and T82 are operated in response to a block group select signal BGSELk for selecting a block group. In the above, if a first memory cell block is selected, the first switching unit PS1 is operated in response to a block group select signal BGSEL1. Accordingly, all the drain pass word lines DPWL included in first to thirty second blocks of the first block group are commonly connected to the global drain pass word line GDPWL. Further, all the source pass word lines SPWL included in first to thirty second blocks of the first block group are commonly connected to the global source pass word line GSPWL. In the above, if a block select signal (for example, BSEL2) for selecting one block within the block group is activated, a block group select signal (for example, BGSEL1) corresponding to a block group including a selected block is also activated.

If the switching units PS1 to PSk for connecting the global pass word lines GSPWL and GDPWL and the pass word lines SPWL and DPWL are installed as described above, an increase in the area occupied by elements can be minimized, and stress applied to a memory cell connected to the pass word lines SPWL and DPWL, or variation in the threshold voltage can be decreased.

As described above, according to the present invention, a pass word line is formed between a select line and a neighboring word line, and at the time of the program/erase operation, bias applied to the pass word lines applied to a selected block and an unselected block are controlled. Accordingly, a difference between the program/erase speed of a memory cell connected to the outermost word line and the program/erase speed of the remaining memory cells can be minimized, and operating characteristics, such as erase/program cycling characteristics, and reliability can be improved.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A flash memory device, comprising:
    a plurality of memory cell blocks, each memory cell block being associated with select lines, pass word lines, and word lines, at least one pass word line being provided between one select line and one word line, the pass word line having a structure in the same manner as the word line;
    an operating voltage generator to output operating voltages to global select lines, global word lines and global pass word lines;
    a block switching unit to connect the global word lines to the word lines and the global select lines to the select lines in response to a block select signal; and
    a voltage supply circuit configured to supply the select lines and the pass word lines of an unselected memory cell block with a ground voltage in response to a block select inverse signal,
    wherein word lines of the unselected memory cell block are set to a floating state when the ground voltage is supplied to the select lines and the pass word lines of the unselected memory cell block.

2. The flash memory device of claim 1, wherein the select lines, the word lines and the pass word lines are formed at a same distance from each other in the memory cell block.

3. The flash memory device of claim 1, wherein the select lines, the word lines and the pass word lines are configured to have the same width.

4. The flash memory device of claim 1, wherein the operating voltage generator comprises:
    a select line voltage generator to supply a first voltage to the global select lines;
    a program/read/erase voltage generator to supply a second voltage to the global word lines; and
    a pass voltage generator to supply a third voltage to the global pass word lines.

5. The flash memory device of claim 4, wherein the word lines of the unselected memory cell block are set to a floating state during a read operation of a selected memory block when both the ground voltage is supplied to the select lines of the unselected block and a read pass voltage is supplied to the pass word lines of the unselected block, wherein the read pass voltage supplied turns on cells connected to the pass word lines.

6. The flash memory device of claim 1, wherein the block switching unit is configured to connect the global pass word lines and the pass word lines in response to the block select signal.

7. The flash memory device of claim 1, wherein the voltage supply circuit is provided in each memory cell block.

8. The flash memory device of claim 1, wherein:
    the voltage supply circuit includes switching elements configured to operate in response to the block select inverse signal, the switch elements having first ends and second ends, the first ends connected to one of the select lines and the pass word lines, the second ends connected to a ground terminal.

9. The flash memory device of claim 1, further comprising a switching unit to connect pass word lines of a block group including two or more of the memory cell blocks to the global pass word line in response to a block group select signal.

10. The flash memory device of claim 9, wherein when the block select signal to select one of the memory cell blocks included in the block group is activated, the block group select signal is activated.

* * * * *